(12) United States Patent
Kato et al.

(10) Patent No.: US 10,545,866 B1
(45) Date of Patent: Jan. 28, 2020

(54) METHOD AND SYSTEM FOR EFFICIENT RE-DETERMINATION OF A DATA VALID WINDOW

(71) Applicant: Cadence Design Systems, Inc., San Jose, CA (US)

(72) Inventors: Yoshiharu Kato, Cupertino, CA (US); Manas Lahon, San Jose, CA (US); Sandeep Brahmadathan, Milpitas, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 134 days.

(21) Appl. No.: 15/639,908

(22) Filed: Jun. 30, 2017

(51) Int. Cl.
*G06F 12/06* (2006.01)
*G06F 1/12* (2006.01)

(52) U.S. Cl.
CPC ............ *G06F 12/0646* (2013.01); *G06F 1/12* (2013.01); *G06F 2212/251* (2013.01)

(58) Field of Classification Search
CPC ........ G06F 1/12; G06F 11/10; G06F 11/3051; G06F 12/0646; G06F 12/16; G06F 13/4243; G06F 1/04; G06F 2212/251
See application file for complete search history.

(56) References Cited

U.S. PATENT DOCUMENTS

| | | | | |
|---|---|---|---|---|
| 2011/0016282 A1* | 1/2011 | Gillingham | ......... | G06F 13/4243 711/167 |
| 2013/0315014 A1* | 11/2013 | Dearth | ................ | G06F 13/1689 365/193 |
| 2014/0195728 A1* | 7/2014 | Hsu | ...................... | G06F 12/0246 711/105 |
| 2016/0049183 A1* | 2/2016 | Bose | ...................... | G06N 20/00 365/193 |
| 2018/0337865 A1* | 11/2018 | Siddaiah | ............... | H04L 47/283 |

* cited by examiner

*Primary Examiner* — Zhuo H Li
(74) *Attorney, Agent, or Firm* — Vista IP Law Group, LLP

(57) ABSTRACT

Disclosed is an improved approach to implement training for memory technologies, where a data valid window is re-determined using boundary information for a new data valid window. The information obtained for the new location of the first edge is used to minimize the computational resources required to identify the location of the second edge. This greatly improves the efficiency of the process to perform the re-training.

18 Claims, 16 Drawing Sheets

METHOD AND SYSTEM FOR EFFICIENT RE-DETERMINATION OF A DATA VALID WINDOW

BACKGROUND

Memory components, such as DRAMS (Dynamic Random Access Memory), are electronic storage mechanisms that are used to store data for computing systems. DRAMs are widely used in digital electronics where low-cost and high-capacity memory is required. For example, a typical application for DRAM products is the main memory for a computer system. There are many types of DRAMs that are used in modern systems, such as for example, DDR (double data rate) systems.

In general, DDR systems transmit data on both edges of a clock/strobe, where the memory system sends and/or receives a data edge aligned with a strobe. However, due to various electrical differences within the memory itself or other components which interact with the memory, the data and strobe might arrive at the memory with varying skews.

The issue addressed by the present disclosure is that periodic training is often needed to ensure that the DDR memory has its strobe properly aligned with the data edges. This is because over time, drifts may occur between the alignment of the clock strobes and the data edges. Such misalignments may cause incorrect data to be stored and/or read by the memory product, unless such skews are accounted for by proper adjustment of delay components.

DDR systems provide the ability to train for the best clock strobe and data settings. To perform this type of training, the delay of the data is varied relative to the strobe (or vice versa) until the proper calibration is achieved. An iterative approach is often taken to perform this training process, where either the clock strobe and/or data position is repositioned by a small "step" through application of instructions to applicable delay components. These incremental steps are taken until the training process identifies the correct adjustments that need to be taken to optimize the setting of the various clock strobe and data components.

The problem is that, depending upon the amount of drift that has occurred, a significant amount of these incremental training steps may need to be taken to accomplish the training process. This causes a period of delay to occur before the memory product can be usefully operated. This delay may not be a significant problem during, for example, the initialization of the memory component upon startup. However, consider when the system that includes the memory component is in the midst of user operation when the training occurs. In this situation, a significant amount of delay in responsiveness due to memory re-training may cause unwanted stalling of the main application that relies upon the memory component, thereby creating perceptible delays and/or possible glitches in the operation of the system.

Therefore, there is a need for an improved approach to implement training for memory technologies that addresses these and other problems of conventional systems.

BRIEF DESCRIPTION OF FIGURES

The drawings illustrate the design and utility of some embodiments of the present invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Embodiments of the invention provide an improved approach to implement training for memory technologies, where a data valid window is re-determined using boundary information for a new data valid window.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration. For example, while the illustrative examples described below are described in the context of DRAM/DDR memory components, it is noted that the inventive concepts described herein are applicable to other types of memory technologies as well, and are not to be limited only to DRAM/DDR applications unless explicitly claimed as such.

As noted above, DDR systems transmit data on both edges of the clock/strobe. For the read path, the DDR memory sends data edge aligned to the strobe. But due to various electrical differences in the path from the memory to the capture apparatus (CA), the data and strobe might arrive at the CA with varying skews. The CA should have a definite setup and hold margin to reliably capture the data. This ultimately leads to a Data Valid Window (DVW) smaller than ½ of the strobe period.

Similarly, in the write path to the memory, the memory subsystem sends data along with the strobe. But the data and strobe might arrive at the memory with varying skews. Also, some memory devices have internal skew between data and the strobe. For reliable capture and storage in the memory device, the strobe should be positioned such that write data is captured with sufficient setup and hold margin at the memory buffers. The memory subsystem should send data in such a way that the strobe arrives at the memory device in the middle of the data valid window at the device capture buffers.

Figure 1:
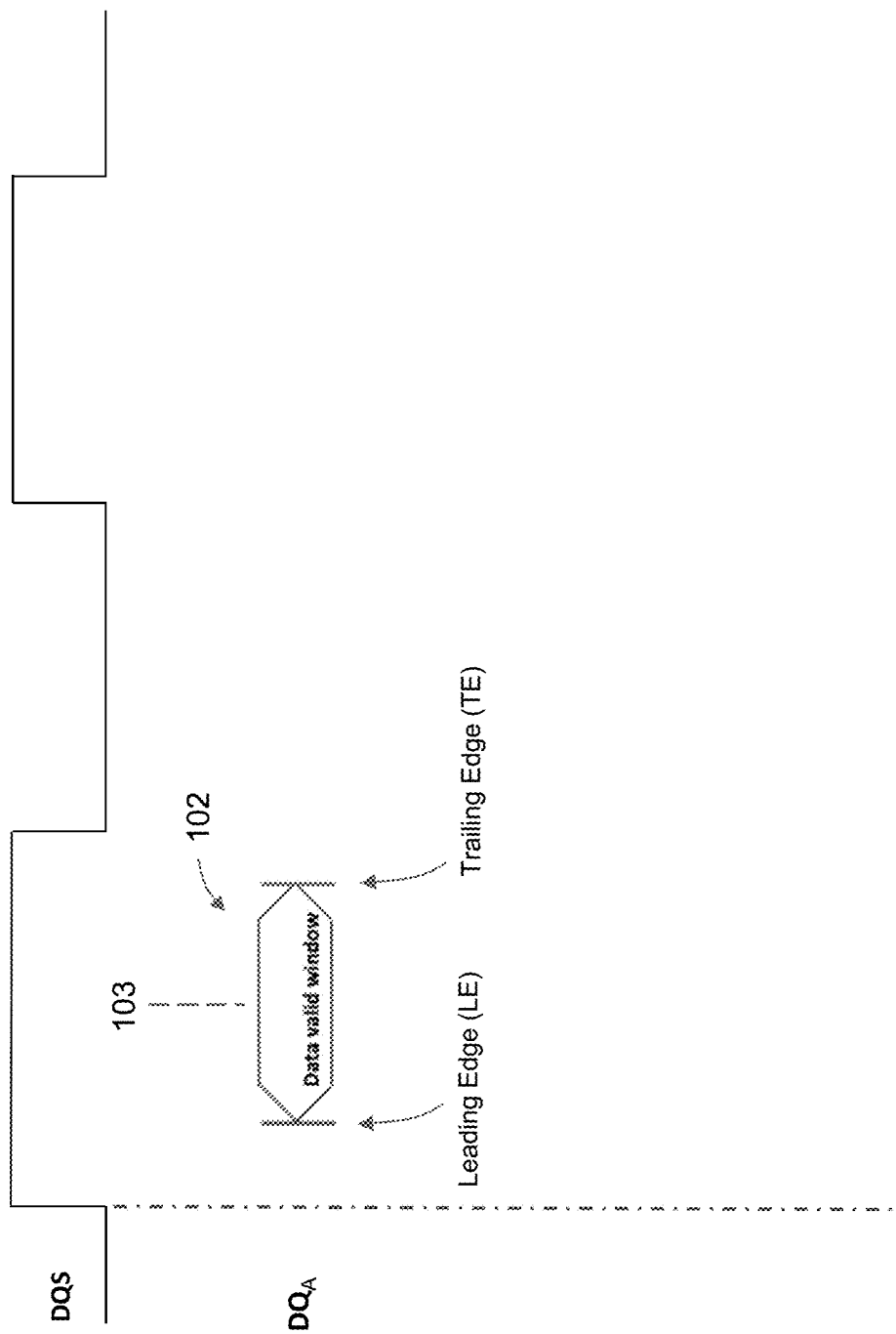
FIG. 1 illustrates an example data valid window.

In FIG. 1, an example DVW 102 is shown corresponding to a DQ signal referred to as $DQ_A$. The DVW 102 includes a leading edge (LE) and a trailing edge (TE). A training routine is performed which determines the entire DVW 102 (e.g., by identifying the LE and the TE), and to identify the midpoint 103 (midpoint between LE and TE). For reads, that midpoint of the DVW 102 is selected as the data capture point (CptrPnt) to ensure best setup and hold margin. For writes, the midpoint of the DVW is selected as the data launch point (LaunchPnt) to ensure best setup and hold margin for the writes to memory.

Figure 2:
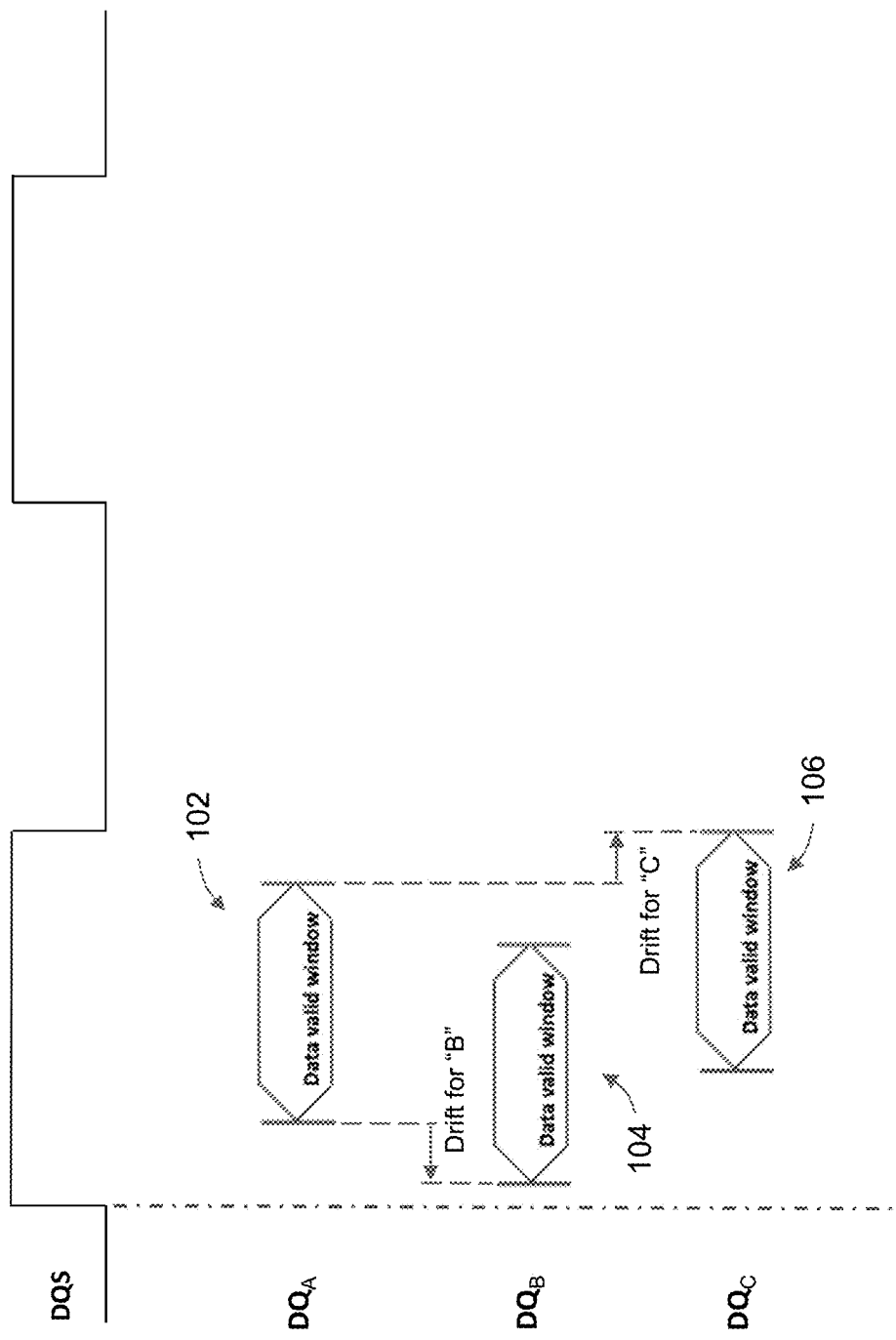
FIG. 2 illustrates example drifts for the data valid window of FIG. 1.

As illustrated in FIG. 2, the DVW of the memory system can drift over time. For example, an original DVW 102 could change to DVW 104 ($DQ_B$) or DVW 106 ($DQ_C$). In particular, it can be seen that DVW 104 results from a drift in the leftward direction. If the DQS and $DQ_B$ stay at their current relative positioning, then the drift will cause the data valid window 104 to be too far to the left relative to DQS, causing possible data errors when operating the memory. Similarly, DVW 106 results from a drift in the rightward direction. Therefore, if the DQS and $DQ_C$ stay at the relative positioning shown in this figure, then the drift will cause the data valid window 106 to be too far to the right relative to DQS, causing possible data errors when operating the memory.

A training routine is performed which determines the entire DVW by placing the data at different delayed positions such that the LE and TE can be determined. However, since the DVW drifts over time even after the training routine is done, periodic training is needed in high speed systems to track the drifts and arrive at the new reliable CptrPnt or LaunchPnt over time.

The periodic training needs to be less time consuming for seamless functioning of a system such that it does not interrupt active services for long durations. The current solution provides an approach that minimizes the analysis time of identifying the new DVW and hence the new CptrPnt or LaunchPnt. Periodic training for the write path is much more time consuming than the read path since the determination of the correct data path delays for the write path needs both Tx (transmission) and Rx (reception) of data to and from memory and subsequent evaluation in the training device. As such, any speedup in the training mechanism/sequence of events can shorten the overall time dramatically.

The approach of the present solution leverages the information of the new leading edge to shorten the time for finding the new trailing edge or vice versa. Any suitable approach can be taken to determine the new DVW using the old DVW information, including for example the old Leading Edge (LE), old Trailing Edge (TE), old CptrPnt, and/or old LaunchPnt. The specifics of that would depend on the periodic algorithm chosen. Irrespective of what method is used, the process would involve finding the new LE and/or TE.

For reads, delay introducing devices are generally used to position the strobe at the CptrPnt. During training, the same delay devices are generally used to sweep the CptrPnt positions to find the new LE and TE. The range of positions that would be tested and the start points of the searches would depend on the periodic training approach that is being used. For writes, delay introducing devices can be used to achieve varying positions of data at the LaunchPnt. During periodic training, the same delay devices are generally used to sweep the LaunchPnt positions to find the new LE and TE. Again, the range of positions that would be tested and the start points of the searches would depend on the periodic training approach that is being used.

Regardless of the specific periodic training approach, the present disclosure introduces the usage of one of the newly found edge information to speed up the training process. To illustrate, assume the periodic training approach always find the new LE first. In the diagram shown in FIG. 2, if the DVW shifts from (102) to (106), it can be seen that both LE and TE moves towards the right from their original positions. Once the periodic training approach finds the new LE position, comparison with the old LE positions yields the information that the DVW has drifted right. This information can be used to speed up the finding the exact location of the new TE. Since the DVW has drifted right, the starting point of the TE search can be accommodated accordingly. For instance, if the TE search was looking for a PASS to FAIL transition from the old CptrPnt (for reads) OR LaunchPnt (for writes) by sweeping towards right, one can now leverage the fact that the LE has drifted towards right, and hence assume that the new TE would be found in the region towards the right of the old TE. Therefore, instead of starting the search of the new TE from old CptrPnt/LaunchPnt position, the search could be started from a position which is CptrPnt/LaunchPnt+(New Le–Old TE). This will speed up the search for the new TE. Once both the TE and LE are found, the new CptrPnt/LaunchPnt can be determined.

In another example, if the periodic training approach attempts to find the new TE by backtracking the search from (old TE+OFFSET) and looks for a FAIL to PASS transition, the current solution can help avoid the search algorithm having to always keep a large OFFSET value. For the example of FIG. 2 where (102) can move to (106), since this particular approach is supposed to detect a FAIL to PASS transition, if OFFSET is small then the starting point (old TE+OFFSET) could already fall in the PASS region. This suggests the use of a large OFFSET value. By utilizing the information of the newly found LE and the direction of its drift, before the new TE search is started, the OFFSET value can be dynamically updated. This means that the standard $OFFSET_{standard}$ value can be a smaller value. In this case, since the new LE has drifted right, TE would also drift right, Hence the starting point of TE can be (old TE+$OFFSET_{standard}$+(new LE–old LE))).

This improved solution therefore means that for any scenario of TE search, the LE search result can be utilized for a shorter computation time of the new TE. This ultimately will shorten the time for the periodic training to arrive at the new CptrPnt/LaunchPnt.

Figure 3:
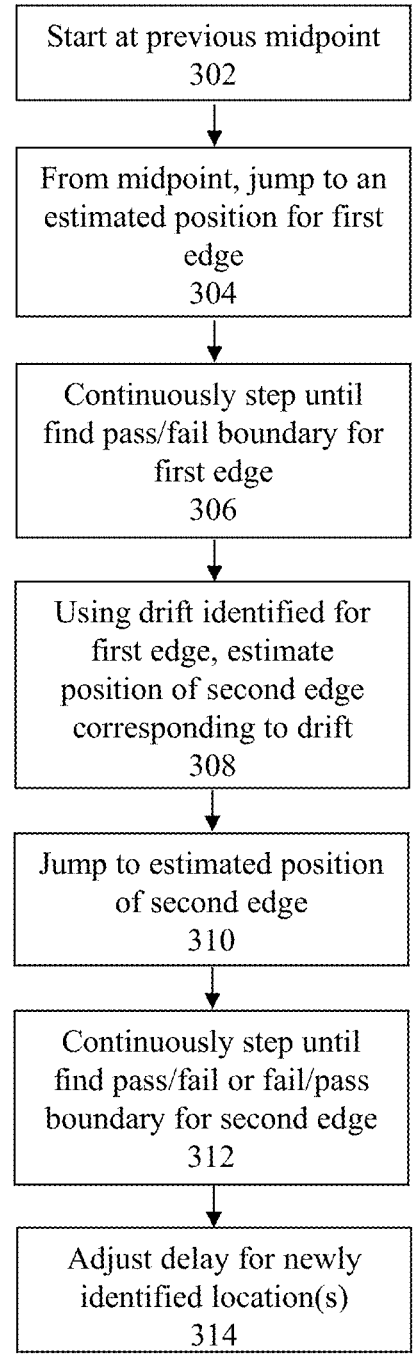
FIG. 3 shows a flowchart of an approach to implement period re-training according to some embodiments of the invention.

FIG. 3 shows a flowchart of an approach to implement period re-training according to some embodiments of the invention, where a first edge (new LE or TE) is identified and is leveraged to determine starting point for the other edge, and hence the new the DFW.

The approach begins by identifying the position of one of the new edges, e.g., the new leading edge or trailing edge. As noted above, any suitable periodic training approach can be employed to make this determination, and thus the specific approach discussed herein is merely illustrative as others can also be employed.

In the present embodiment, at 302, the approach begins from the previous midpoint. The previous midpoint could be an affirmatively stored value corresponding to the old midpoint location, CptrPnt value, and/or/LaunchPnt value. If the system to which the invention is applied does not persistently store the midpoint value but instead stores the old LE/TE values, then the old midpoint value could be derived as the midpoint location between the old LE and old TE values.

An estimation is then made of the new edge to be identified. Any suitable approach can be taken to estimate the location of the new edge. For example, assume that it is desired to estimate the location of the new leading edge. One possible approach that can be taken is to simply use the location of the old leading edge. Alternatively, the estimated position of the new LE can be derived by using the old LE position offset by a small margin. Yet another approach is to apply heuristics to determine the new LE based at least in part upon a set of rules that uses various system conditions to attempt to derive the new LE. Machine learning can also be used to gather and analyze system signals, and from learned behavior, to estimate the new location of the LE. Any of these approaches can, of course, also be used to also estimate the trailing edge position.

At 304, a jump is performed to the estimated location of the first edge to be determined. From this location, the approach continuously steps, at 306, until a pass/fail boundary is identified. The idea is that when the jump to the estimated location is performed, the new position will either be in a PASS region or a FAIL region. By moving in small increments from that position, the movement will result eventually in a transition from the PASS to a FAIL (if initially in a PASS location) or a transition from FAIL to PASS (if initially in a FAIL location). That transition location would be the location of the first edge to be identified.

The new location of the first edge can then be used to identify the estimate amount of drift that has occurred. At 308, the drift identified for the first edge can therefore be used estimate the position of the second edge that is to be identified. As with the first edge, any suitable approach can be taken to estimate the base position of the second edge. For example, old edge position can be used as the estimate, and/or the old edge position offset by a small margin. In addition, as discussed above, heuristics and/or machine learning may be applied to estimate the new edge location. From that base estimated position, the drift identified for the first edge is applied to generate the final estimate of the second edge.

At 310, a jump is performed to the estimated location of the second edge to be determined, where the previously identified drift is factored into this estimated position. From this location, the approach continuously steps, at 312, until a pass/fail boundary is identified. That identified PASS/FAIL location corresponds to the location of the second edge.

At this point, both the new leading edge and the new trailing edge have now been identified. Therefore, the boundaries of the new data valid windows are known, and hence the midpoint of the DVW can be identified. From this midpoint, the new CptrPnt value and/or LaunchPnt value is known. As such, at 314, the delay line for the DQS and/or DQ can now be adjusted to account for any skews that may have occurred since the last training occurred.

Figure 4:
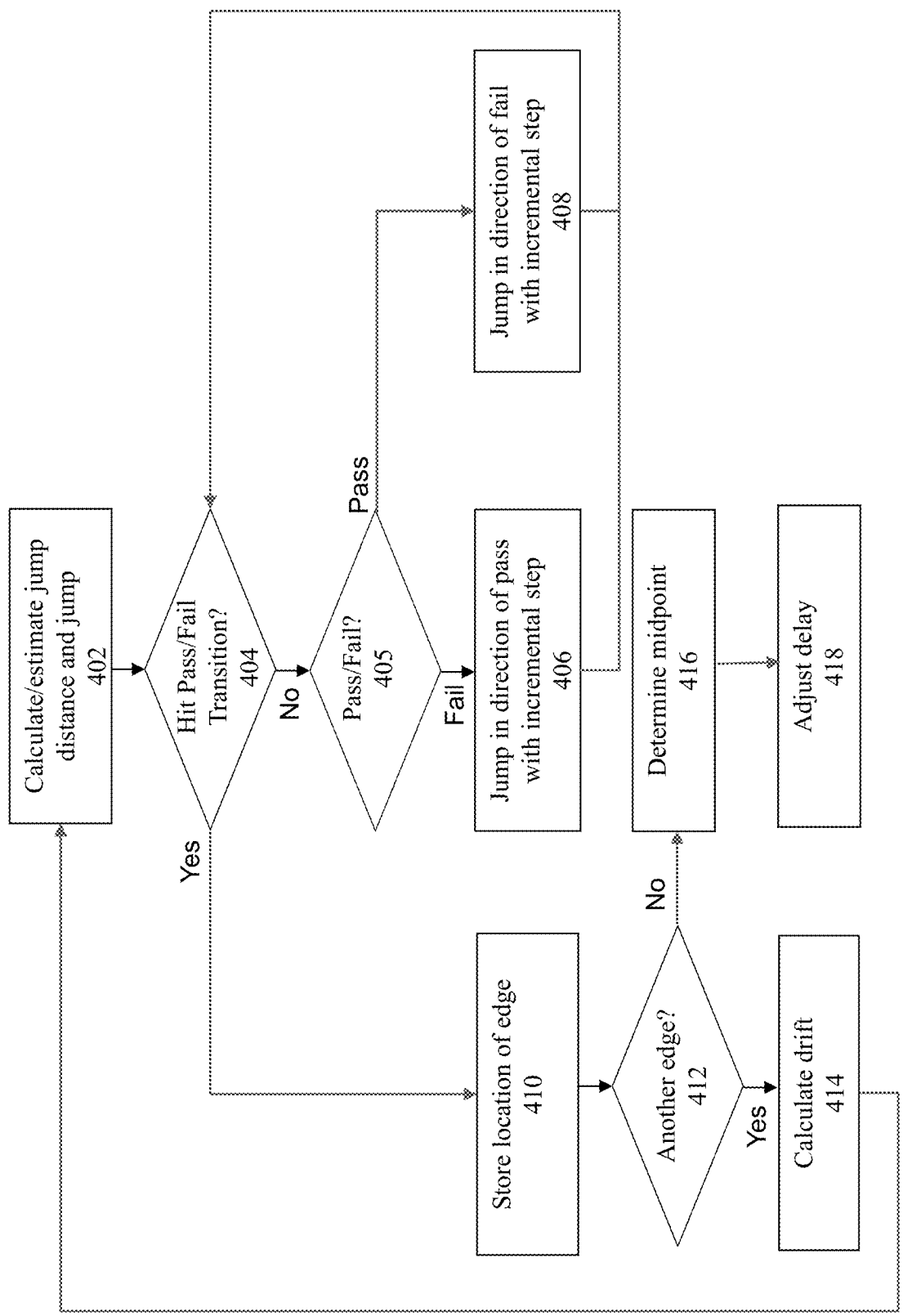
FIG. 4 shows a more detailed flowchart for performing periodic re-training according to some embodiments of the invention.

FIG. 4 shows a more detailed flowchart for performing periodic re-training according to some embodiments of the invention, where a first edge (new LE or TE) is identified and is leveraged to determine starting point for the other edge, and hence the new the DFW.

At 402, the estimated location is identified for the first edge to be determined, and the process jumps to that location. A determination is made at 404 whether a pass/fail transition was reached from the jump. Since at this point, the jump is the initial jump, a pass/fail transition could not have yet been reached. Therefore, the process proceeds to 405 to make a determination whether the current location is a pass location or a fail location.

If the current location is a PASS location, then the process will next make an incremental jump in the FAIL direction at 408. When searching for the pass/fail transition for the leading edge, this means that the jump direction will be towards the left. On the other hand, when searching for the pass/fail transition for the trailing edge, this means that the jump direction will be towards the right.

If the current location is a FAIL location, then the process will next make an incremental jump in the PASS direction at 406. When searching for the pass/fail transition for the leading edge, this means that the direction to jump to find PASS will be towards the right. On the other hand, when searching for the pass/fail transition for the trailing edge, this means that the jump direction will be towards the left.

In either case, the jump will result in the process returning back to 404 to identify whether the jump has resulting in reaching the pass/fail boundary. This iterative process occurs until the pass/fail transition has been reached.

Once the pass/fail transition is reached, then the process proceeds to 410 to store the location of the edge. At 412, a determination is made whether there are any further edges for which a location needs to be determined. Assuming that the prior processing was to identify the first edge, then the processing at 412 will recognize that there is still a second edge to be determined. Therefore, at 414, the drift is calculated from a review of the new location of the first edge from the previous location for that same edge.

The process then returns to 402 to generate (and jump to) an estimated location for the second edge. The above processing is then repeated to identify the pass/fail boundary location for the second edge. Once the second edge location has been found, that location is then stored at 410. The determination made at 412 then checks whether there are any additional edges to be identified. Since the second edge has been identified, there are no further edges left for determination.

At this point, the process proceeds to 416 to identify the midpoint of the new data valid window. This location is calculated from identifying the midpoint between the newly identified leading edge and the newly identified trailing edge.

At 418, the delay line for the DQS and/or DQ can now be adjusted to account for any skews that may have occurred since the last training occurred. In some embodiments, modification to the DQS strobe is performed to accomplish alignment for read operations, while modification to the DQ signal is performed to accomplish alignment for write operations. In an alternate embodiment, the reverse occurs, where modification to the DQ signal is performed to accomplish alignment for read operations, while modification to the DQS strobe is performed to accomplish alignment for write operations write operations. Other embodiments may cause modifications to DQS strobe for both types of operations, modifications to DQ signal(s) for both types of operations, or any combination thereof.

Figure 5A:
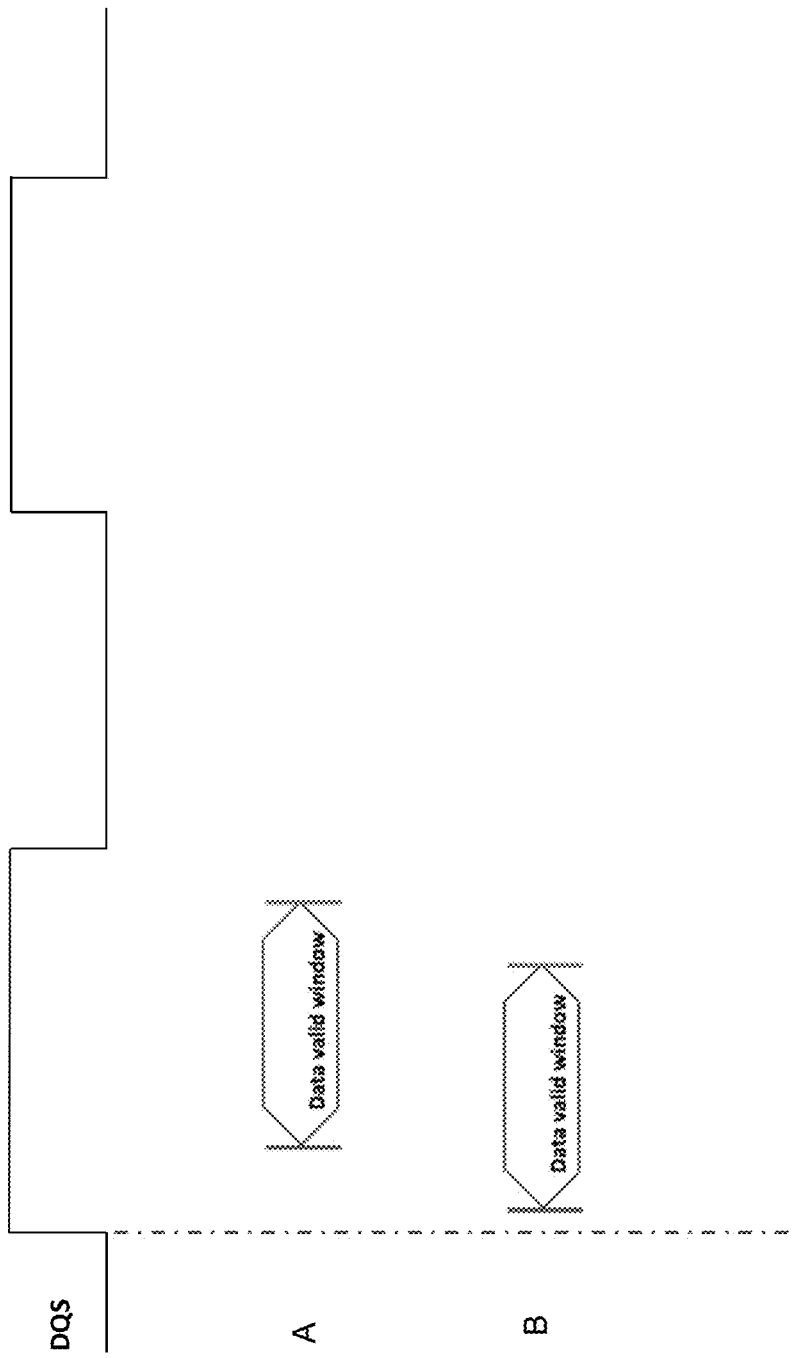
FIGS. 5A-K provide an illustration for this process according to some embodiments of the invention.

FIGS. 5A-K provide an illustration for this process according to some embodiments of the invention. FIG. 5A shows a data valid window for situation A for which training was previously performed to configure the current DQS. As such, the DQS is currently in alignment with the DVW for A. As previous noted, a training routine was performed which determined the entire DVW for A, which was used to identify its midpoint (midpoint between LE and TE) that was selected as the data capture point (CptrPnt) and/or data launch point (LaunchPnt).

At a later point in time, the DVW drifted to the circumstance identified as B. Here, it can be seen that the DVW for B corresponds to a drift in the leftward direction. If the DQS and DQ stay at their current configuration relative to each other, then the drift will cause the data valid window for B to be too far to the left relative to DQS, causing possible data errors when operating the memory.

Figure 5B:
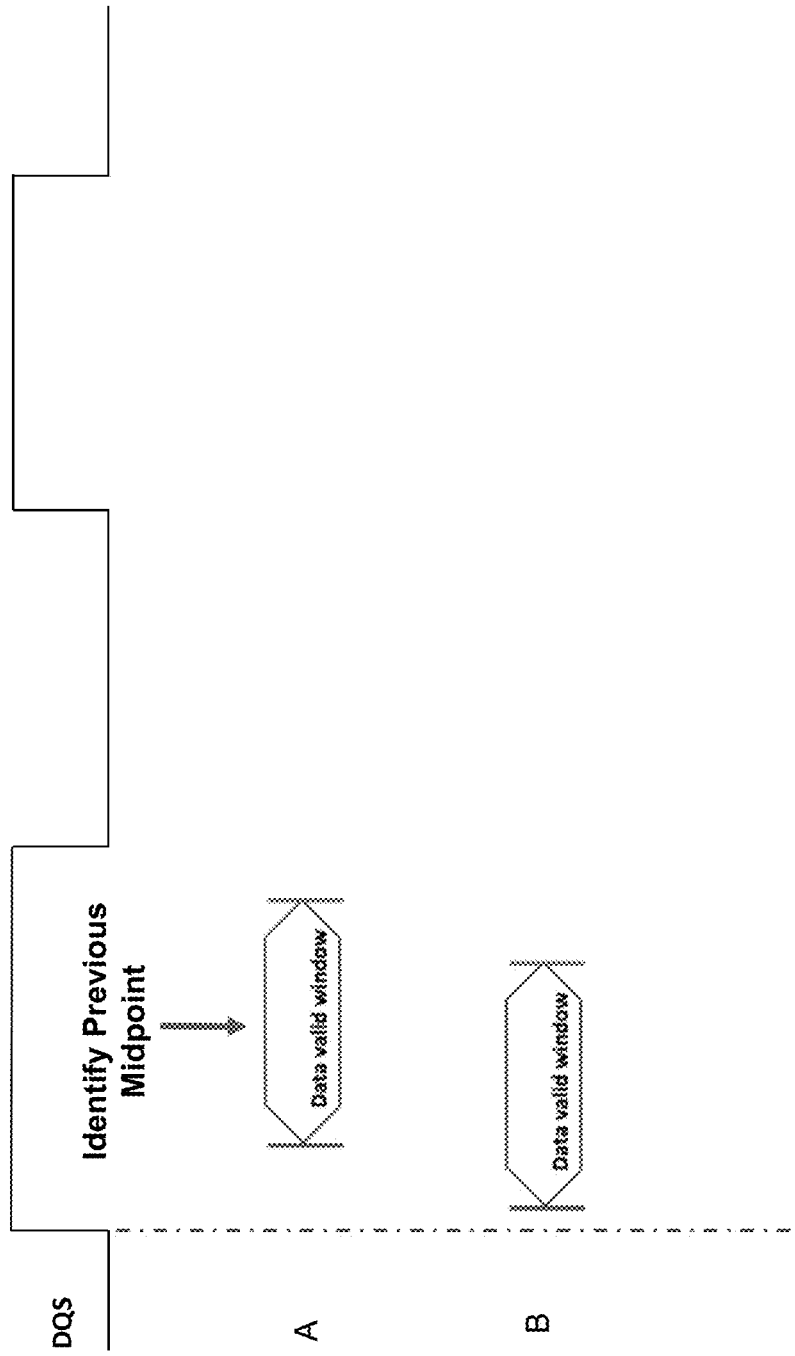

As shown in FIG. 5B, the re-training process in some embodiments begins with the identification of the previous midpoint. This is the previous location of the data capture point (CptrPnt) and/or data launch point (LaunchPnt). Alternatively, this location can be calculated as the midpoint between the previous leading edge and the previous trailing edge.

Figure 5C:
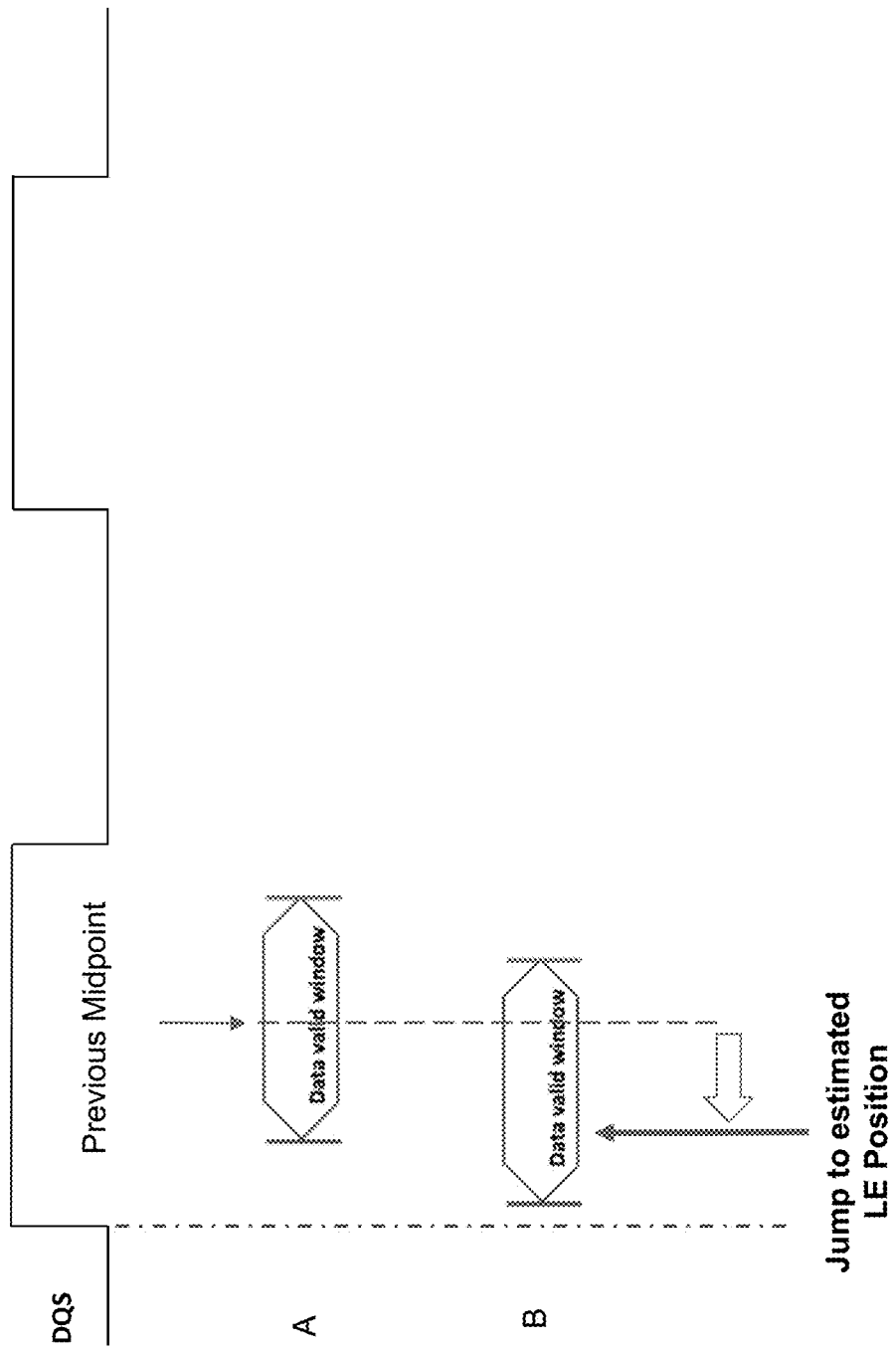

Assume that the illustrative process begins by identifying the leading edge. As illustrated in FIG. 5C, a jump is performed to the estimated position of the LE. Any suitable approach can be taken to estimate the LE. One possible approach that can be taken is to use a slightly smaller value than the jump distance to the location of the previous leading edge. This jump is smaller than the distance to the previous LE position to account for the fact that the drift could have occurred in either the left direction or the right direction, and a smaller estimated jump distance than to the previous LE position means that less iterative jumps would be necessary if the drift actually occurs to the right.

Figure 5D:
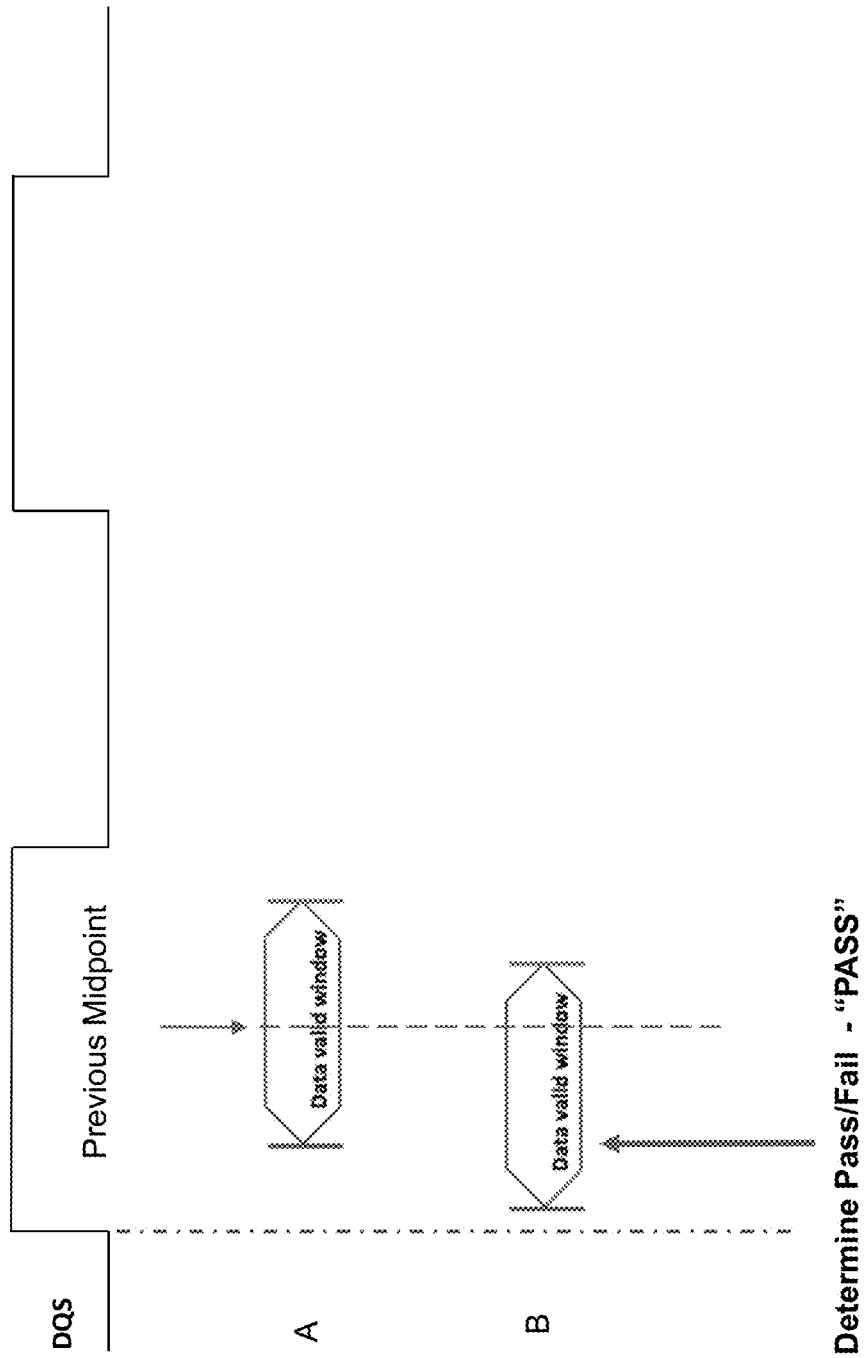

FIG. 5D illustrates the determination of whether the current location is a PASS or a FAIL. Since the current location is within the data valid window for B, this means that the current location corresponds to a PASS.

Figure 5E:
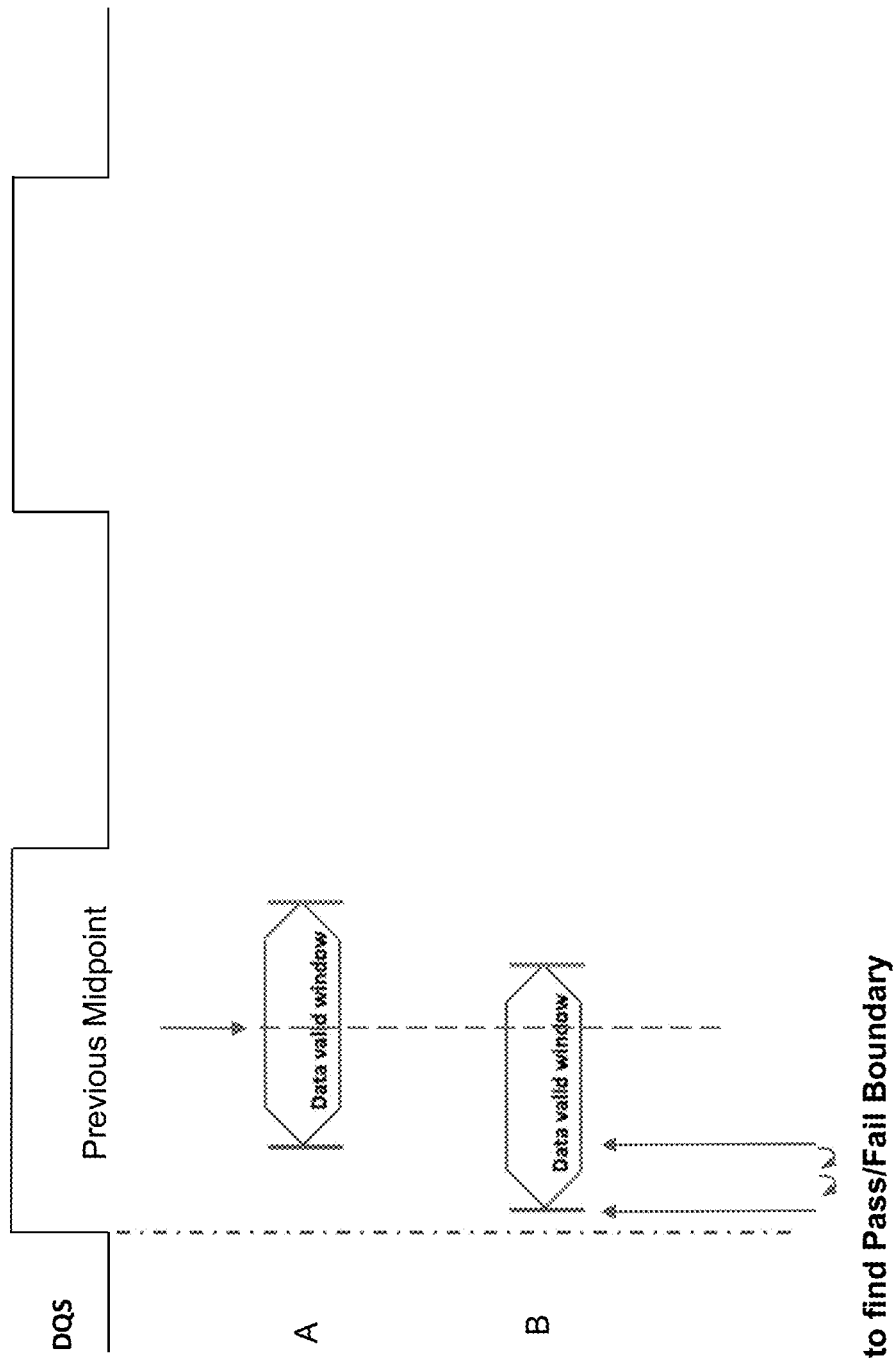
Figure 5F:
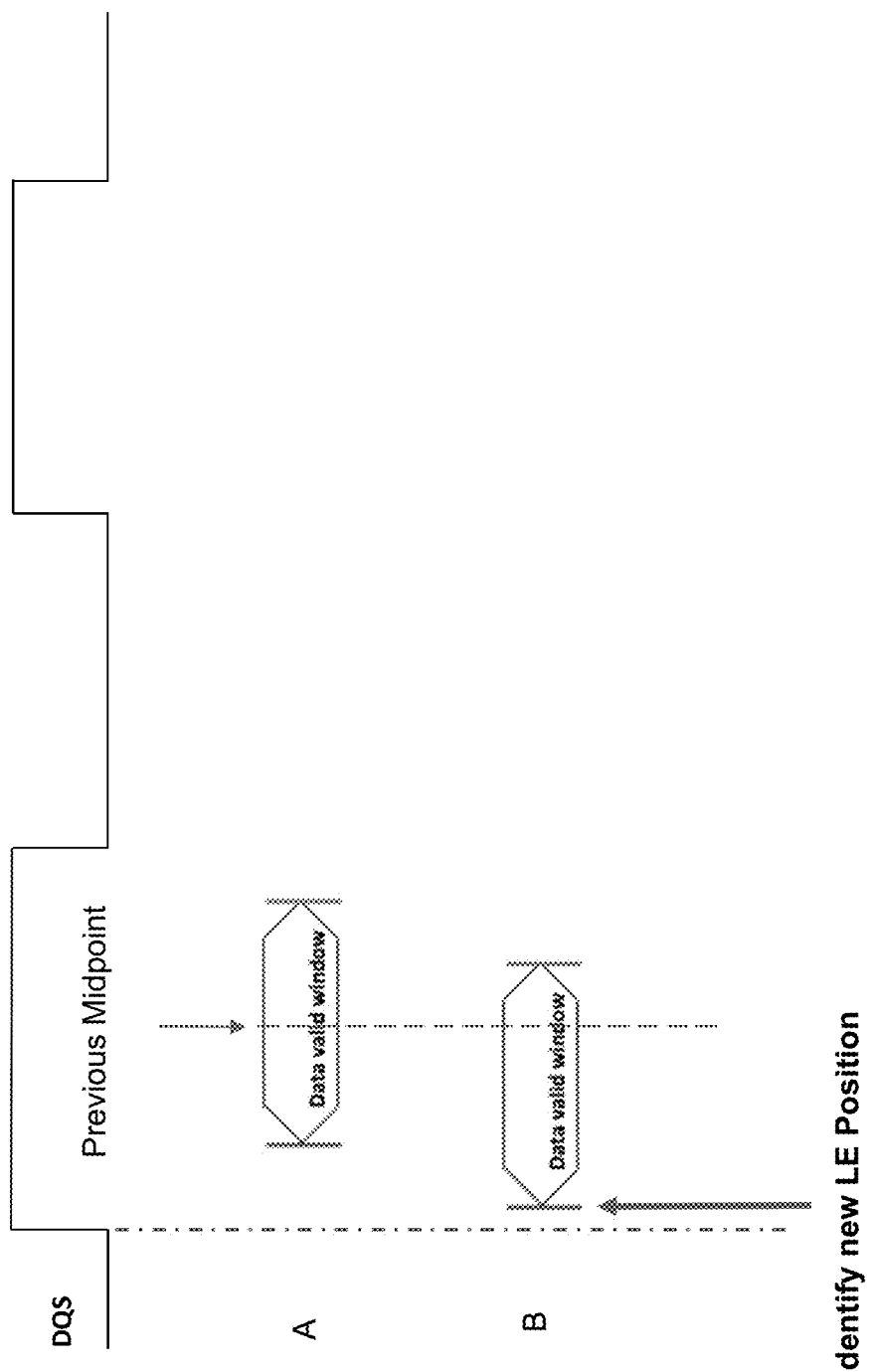

At this point, as shown in FIG. 5E, an iterative series of steps is performed to identify a PASS/FAIL transition boundary. Since the current location was a PASS location, then the process will next make incremental jumps in the FAIL direction, which is in the leftward direction when searching for the leading edge. This iterative process occurs until the PASS/FAIL transition has been reached. Eventually, as shown in FIG. 5F, the PASS/FAIL transition is reached for the leading edge. This position is the location of the new leading edge for B.

Figure 5G:
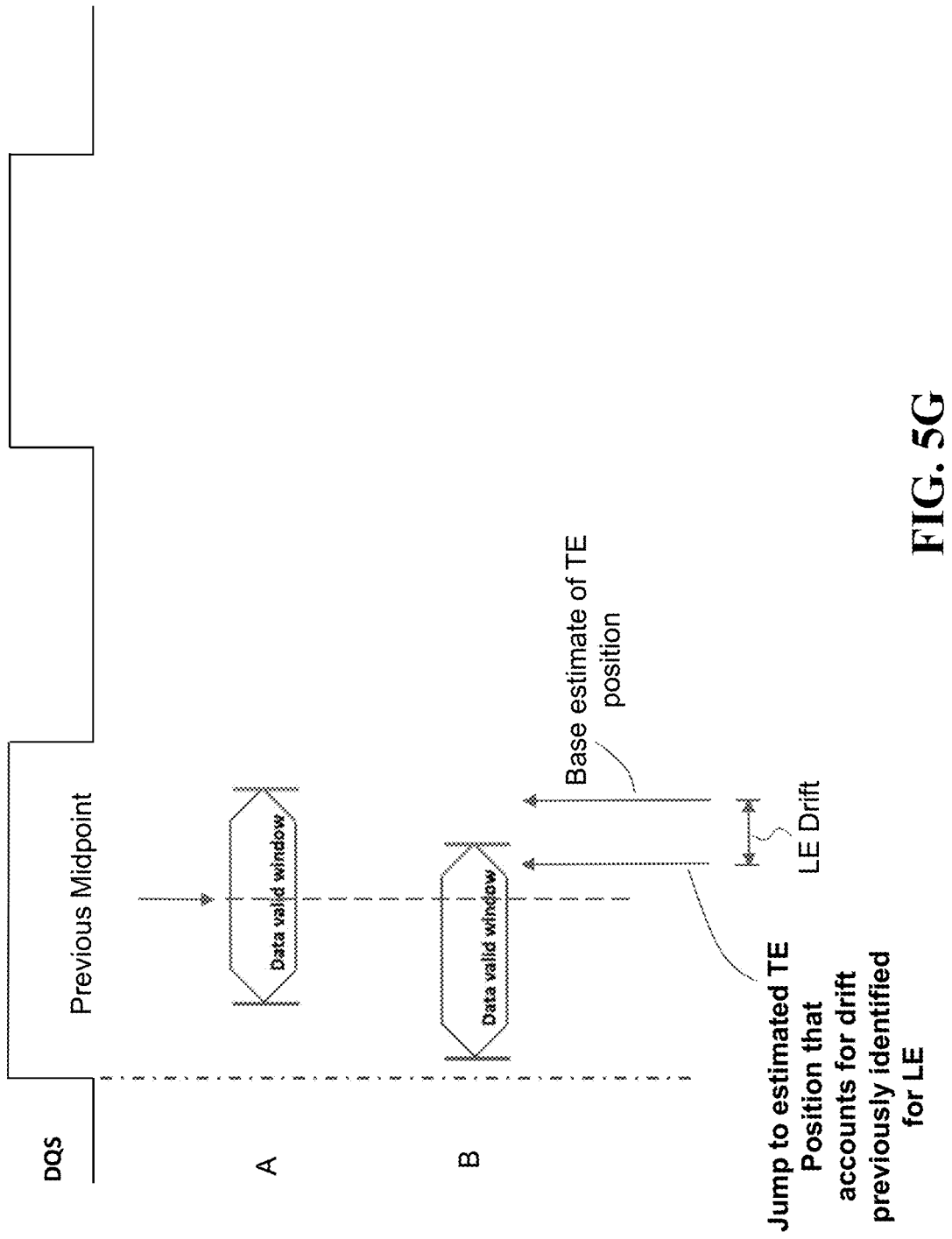

The new location of the leading edge can then be used to identify the estimated amount of drift that has occurred. The drift identified for the leading edge is used to estimate the position of the trailing edge that is to be identified. As shown in FIG. 5G, the next jump is therefore to a position that takes the base estimate of the trailing edge and shifts that base estimate by the drift calculated for the leading edge.

Figure 5H:
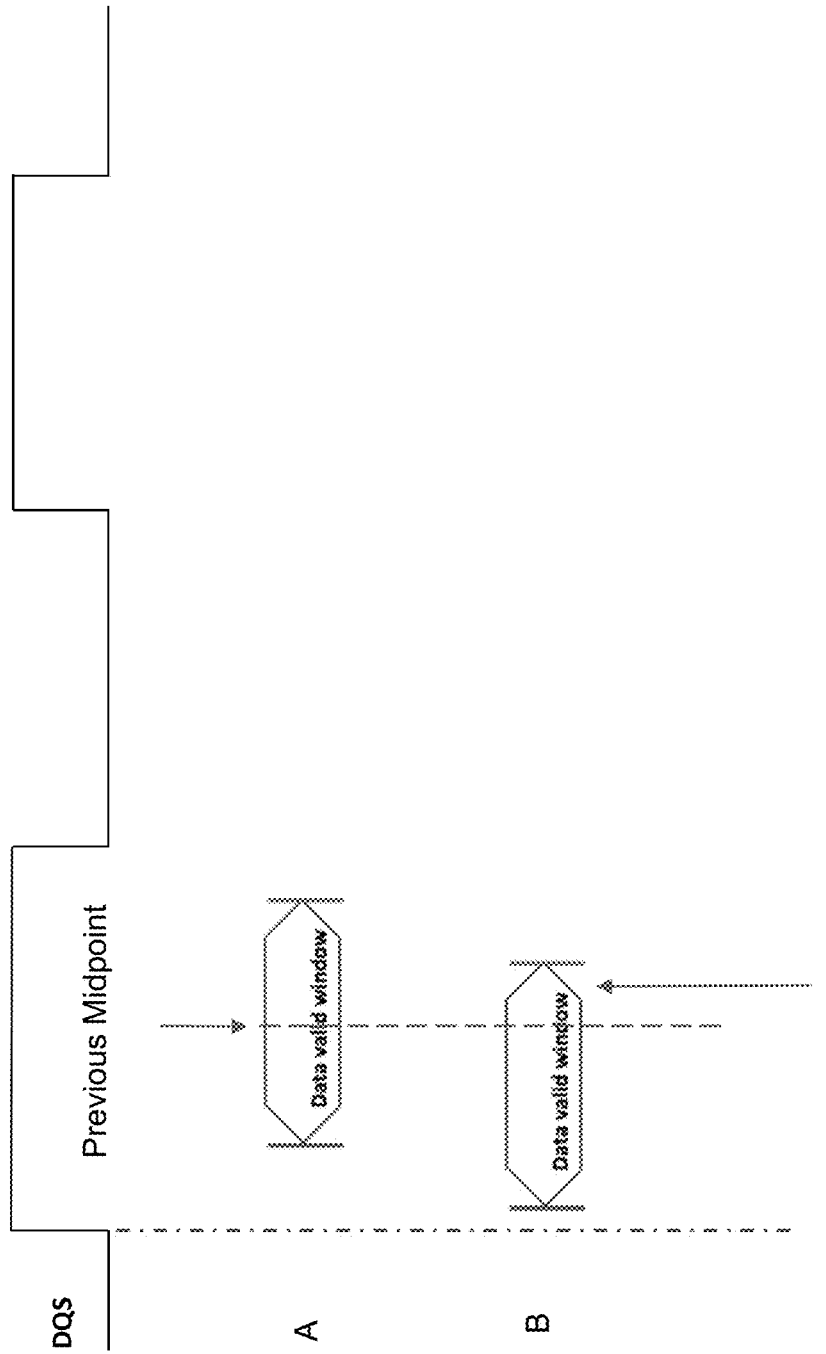

FIG. 5H illustrates the determination of whether the current location is a PASS or a FAIL. Since the current location is within the data valid window for B, this means that the current location corresponds to a PASS.

Figure 5I:
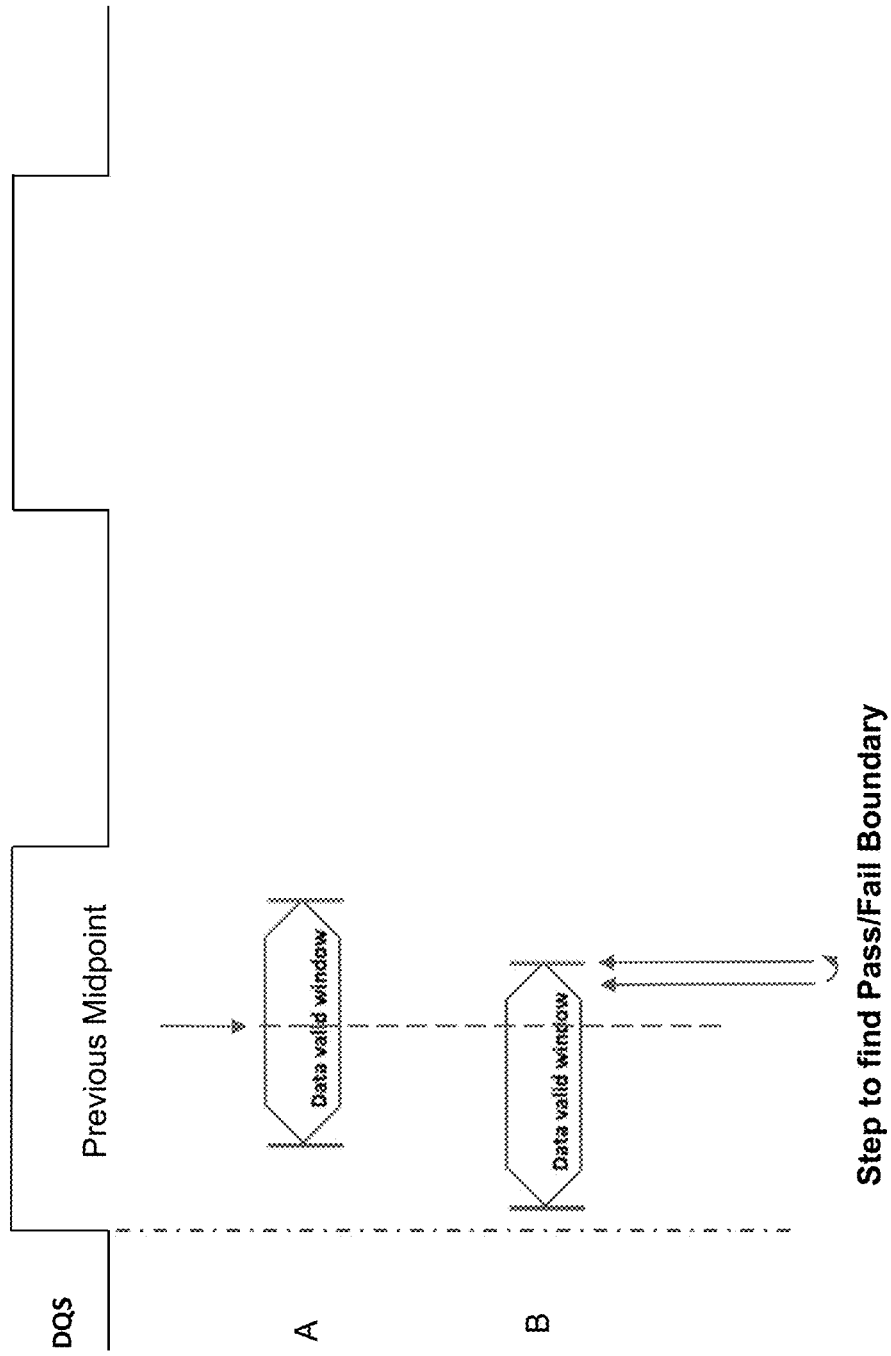
Figure 5J:
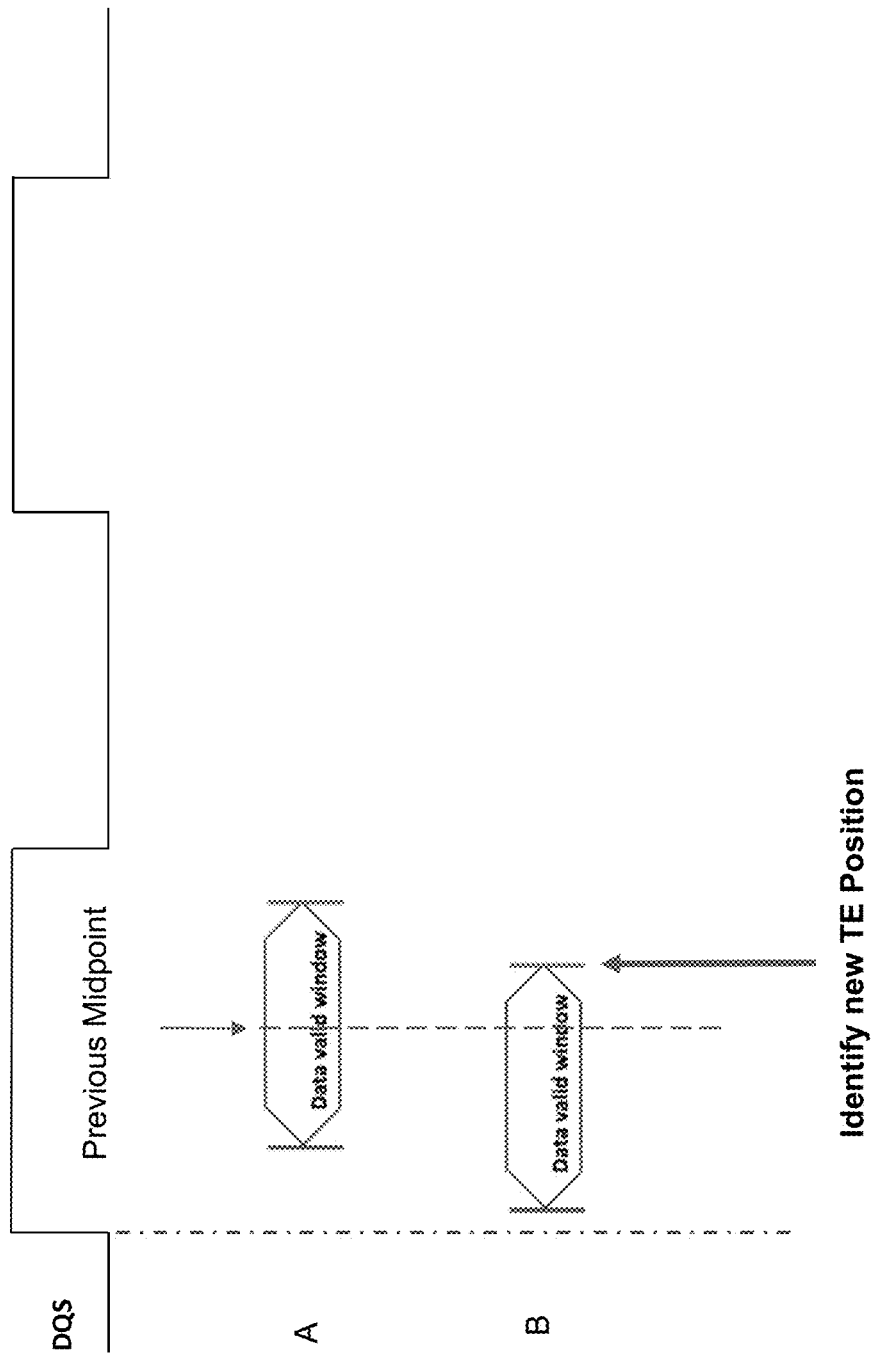
Figure 5K:
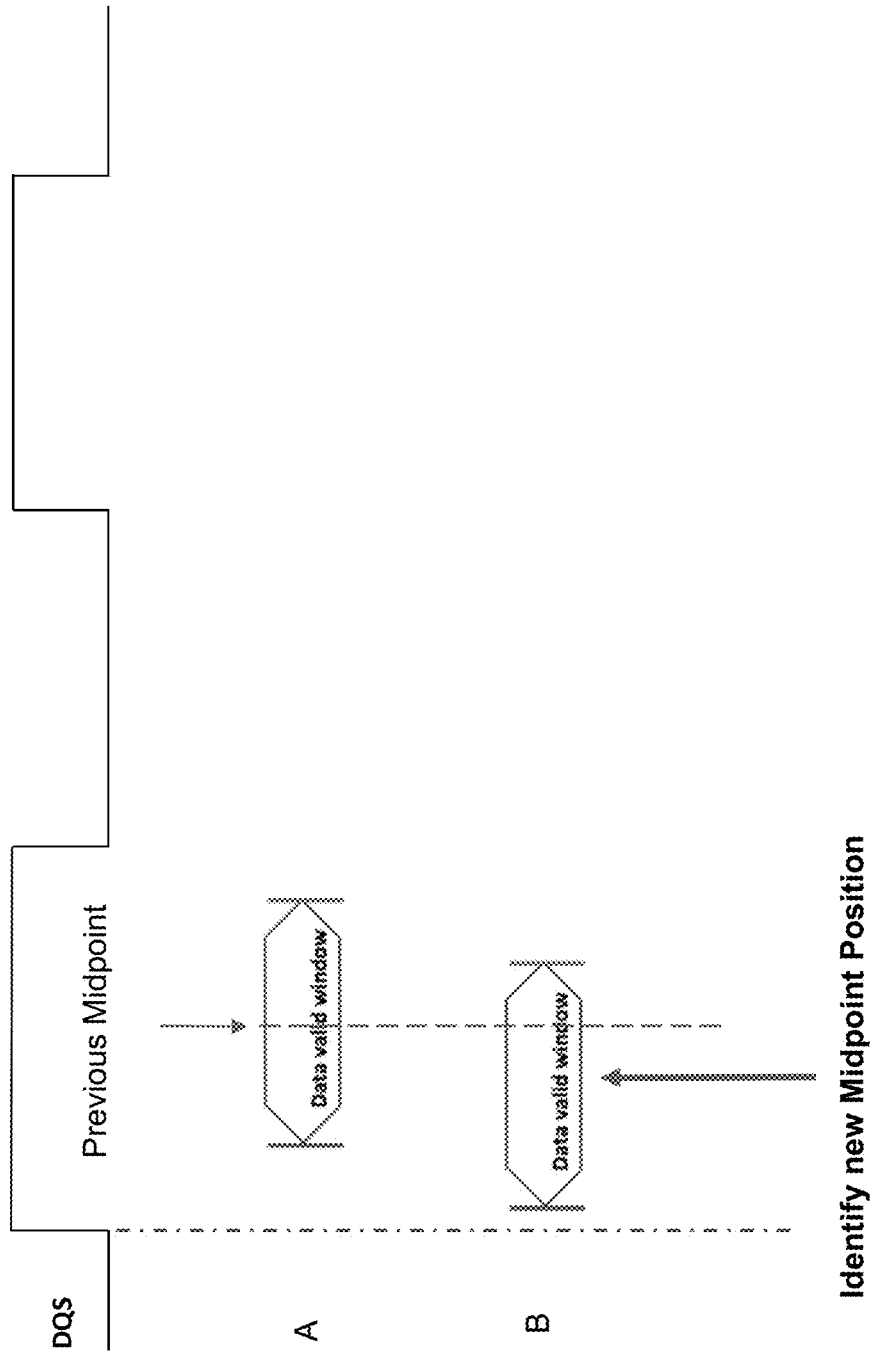

From this location, the approach continuously steps until a pass/fail boundary is identified for the trailing edge. As illustrated in FIG. 5I, an iterative series of steps is performed to identify a PASS/FAIL transition boundary. Since the current location was a PASS location, then the process will next make incremental jumps in the FAIL direction, which is in the rightwards direction for the trailing edge. This iterative process occurs until the PASS/FAIL transition has been reached. Eventually, as shown in FIG. 5J, the PASS/FAIL transition is identified for the trailing edge. This position is the location of the new trailing edge for B.

It is noted that the estimated TE location shown in FIG. 5G that takes the LE drift into account is much closer to the new TE position as compared to the location of the base estimate position for the TE. This means that far fewer incremental/iterative steps are needed using the present approach to identify the new TE position (since the starting point is much closer to that new TE location). This greatly reduces the amount of time that is needed to achieve the goal of the periodic re-training process to determine the new data valid window. In addition, this approach can greatly reduce the amount of processor, memory, and/or other computational resources required to perform the re-training process. By way of example, consider that each iteration of the write training process includes a write operation (e.g., a 16 burst write) followed by a read operation (e.g., a 16 burst read), where additional cycles are consumed to flop the results, and for a training module to verify whether the Tx data matches the Rx data. The entire iteration may consume a significant number of clock cycles (e.g., 70-80 clocks). By using the location/drift calculated for the first edge to better estimate the location of the second edge, a reduction is accomplished in the number of these iterations that are needed to identify the second edge, and hence savings in the computational resources as illustrated above.

At this point, both the new leading edge and the new trailing edge have now been identified for B. Therefore, the boundaries of the new data valid windows are known, and hence the midpoint of the DVW can be identified. From this midpoint, the new CptrPnt value and/or LaunchPnt value is known. As such, the delay line for the DQS and/or DQ can now be adjusted to account for any skews that may have occurred since the last training occurred.

Figure 6:
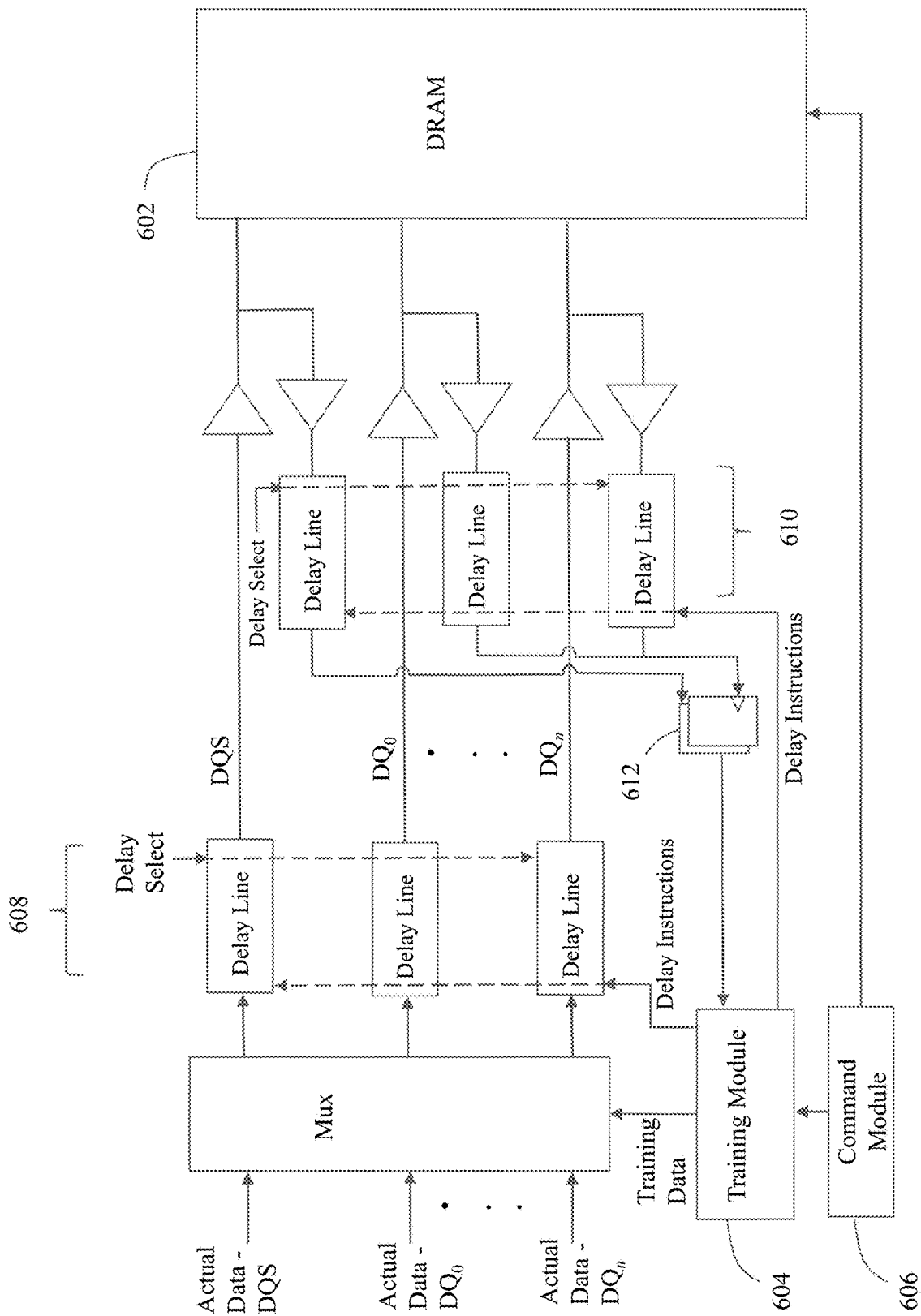
FIG. 6 illustrates components of a memory system that are employable to perform the re-training approach described herein.

FIG. 6 illustrates components of a memory system that are employable to perform the re-training approach described above for a memory device 602. During the re-training process, the command module 606 instructs the training module 604 controls the memory interface to perform the processing as described herein.

During write training, instead of actual data, training data is directed to be stored within memory 602 through delay lines 608. The training module instructs the delay lines to sweep delay values to identify the leading edge and the trailing edge. Each iteration of a write is followed by an iteration of a read, where data within the memory 602 is accessed through delay lines 610, where the read data is passed through register/flip-flop components 612.

The data that is read from memory 602 is checked against the training data that was written to the memory 602. Using the process described above, the training module 604 instructs one or more sweeps through different delay values within delay lines to identify the leading edge and trailing edge. In particular, once a first edge location has been identified, that value can be used to determine the location of the second edge. Once the appropriate LE and TE positions have been identified, the delay lines are instructed to appropriate values relative to their midpoint for the LaunchPnt value. At that point, the system is controlled for the actual data to be written instead of the training data.

During read training, training data that was pre-loaded onto memory 602 is accessed through delay lines 610. The training module 604 checks the data that is actually received against the known data that was supposed to be read from memory. Using the process described above, the training module 604 instructs sweeping through different delay values within delay lines 612 to identify the leading edge and trailing edge. Once a first edge location has been identified, that value can be used to determine the location of the second edge. When the appropriate LE and TE positions have been identified, the delay lines are instructed to appropriate values relative to their midpoint for the CptrPnt value.

Therefore, what has been described is an improved approach to implement training for memory technologies, where a data valid window is re-determined using boundary information for a new data valid window. The approach of the present solution leverages the drift information obtained for the new location of the first edge to minimize the computational resources (computational time, processor usage, memory consumption) for identifying the location of the second edge. This greatly improves the efficiency of the process to perform the re-training.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for re-training a memory, comprising:
   identifying a first edge location for a data valid window for a memory device;
   determining a drift value for the first edge location relative to a previous edge location of the data valid window; and
   identifying a second edge location for the data valid window for the memory device using the drift value for the first edge location, by:
      generating an estimated location for a second edge location for the data valid window using the drift value for the first edge location by adding the drift value to a value corresponding to the second edge location; and
      iteratively adjusting the estimated location for the second edge location, wherein iteratively adjusting the estimated location for the second edge location, is performed to identify a pass/fail transition, the iteratively adjusting going in a direction of pass if a current location is a fail location, and the iteratively adjusting going in a direction of fail if a current location is a pass location.

2. The method of claim 1, wherein delay introducing devices position a strobe at a capture point or launch point, and the delay introducing devices are used to sweep to positions to identify the first edge location and the second edge location.

3. The method of claim 1, wherein a search starting point for the second edge location corresponds to the following: (data capture point)/(launch point)+(new leading edge−old leading edge).

4. The method of claim 1, wherein a search for the second edge location corresponds to a dynamically adjusted offset location for the second edge location.

5. The method of claim 4, wherein a search starting point for the second edge location corresponds to the following: old second edge location+$OFFSET_{standard}$+(first edge location−old first edge location).

6. The method of claim 1, wherein the first edge location is identified by:
   estimating the first edge location using the previous edge location;
   iteratively stepping through different locations until a pass/fail transition is identified; and
   recording the pass/fail transition as the first edge location.

7. The method of claim 1, further comprising determining a midpoint value for the data valid window relative to the first edge location and the second edge location to configure one or more delay values for the memory device, wherein the one or more delay values for the memory device corresponds to one or more delay lines for a data strobe for the memory device.

8. The method of claim 1, wherein the memory device corresponds to a DRAM or DDR device.

9. A system for re-training a memory, comprising:
   a memory device coupled to a plurality of interface lines;
   a first set of delay lines corresponding to a write path for the memory device;
   a second set of delay lines corresponding to a read path for the memory device; and
   a training mechanism that trains the memory device by:
      identifying a first edge location for a data valid window for the memory device;
      determining a drift value for the first edge location relative to a previous edge location of the data valid window; and
      identifying a second edge location for the data valid window for the memory device using the drift value for the first edge location, by:
         generating an estimated location for a second edge location for the data valid window using the drift value for the first edge location by adding the drift value to a value corresponding to the second edge location; and
         iteratively adjusting the estimated location for the second edge location, wherein iteratively adjusting the estimated location for the second edge location, is performed to identify a pass/fail transition, the iteratively adjusting going in a direction of pass if a current location is a fail location, and the iteratively adjusting going in a direction of fail if a current location is a pass location.

10. The system of claim 9, wherein the training mechanism provides training data through the first set of delay lines of the write path to the memory device, and the training data is compared to data actually received from the memory device to identify a pass location or a fail location for the data valid window.

11. The system of claim 9, wherein the first set of delay lines or the second set of delay lines are used to sweep to positions to identify the first edge location and the second edge location.

12. The system of claim 9, wherein a search starting point for the second edge location corresponds to the following: (data capture point)/(launch point)+(new leading edge−old leading edge).

13. The system of claim 9, wherein a search for the second edge location corresponds to a dynamically adjusted offset location for the second edge location.

14. The system of claim 13, wherein a search starting point for the second edge location corresponds to the following: old second edge location+$OFFSET_{standard}$+(first edge location−old first edge location).

15. The system of claim 9, wherein the training mechanisms operates to identify the first edge location by: estimating the first edge location using the previous edge location; iteratively stepping through different locations until a pass/fail transition is identified; and recording the pass/fail transition as the first edge location.

16. The system of claim 9, further comprising determining a midpoint value for the data valid window relative to the first edge location and the second edge location to configure one or more delay values for the memory device, wherein the one or more delay values for the memory device corresponds to one or more delay lines for a data strobe for the memory device.

17. A system for re-training a memory, comprising:
- a memory device coupled to a plurality of interface lines;
- a first set of delay lines corresponding to a write path for the memory device;
- a second set of delay lines corresponding to a read path for the memory device; and
- a training mechanism that trains the memory device by:
    - identifying a first edge location for a data valid window for the memory device;
    - determining a drift value for the first edge location relative to a previous edge location of the data valid window; and
    - identifying a second edge location for the data valid window for the memory device using the drift value for the first edge location, wherein a search for the second edge location corresponds to a dynamically adjusted offset location for the second edge location, by:
        - generating an estimated location for a second edge location for the data valid window using the drift value for the first edge location by adding the drift value to a value corresponding to the second edge location; and
        - iteratively adjusting the estimated location for the second edge location.

18. The system of claim 17, wherein the training mechanism provides training data through the first set of delay lines of the write path to the memory device, and the training data is compared to data actually received from the memory device to identify a pass location or a fail location for the data valid window.

* * * * *